(12) United States Patent
Cheng

(10) Patent No.: US 10,991,917 B2
(45) Date of Patent: Apr. 27, 2021

(54) ARRAY SUBSTRATE AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/489,165

(22) PCT Filed: Sep. 4, 2018

(86) PCT No.: PCT/CN2018/103994
§ 371 (c)(1),
(2) Date: Aug. 27, 2019

(87) PCT Pub. No.: WO2019/042474
PCT Pub. Date: Mar. 7, 2019

(65) Prior Publication Data
US 2020/0013992 A1    Jan. 9, 2020

(30) Foreign Application Priority Data

Sep. 4, 2017    (CN) .......................... 201721127658.4

(51) Int. Cl.
*H01L 27/32* (2006.01)
*H01L 27/12* (2006.01)
(Continued)

(52) U.S. Cl.
CPC .......... *H01L 51/56* (2013.01); *H01L 27/3258* (2013.01); *H01L 27/3276* (2013.01);
(Continued)

(58) Field of Classification Search
CPC ... H01L 27/12; H01L 27/124; H01L 27/3258; H01L 27/326; H01L 27/3262;
(Continued)

(56) References Cited

U.S. PATENT DOCUMENTS 9,129,923 B1 * 9/2015 Han .................... H01L 27/3262
2010/0207106 A1   8/2010 Lhee et al.
(Continued)

FOREIGN PATENT DOCUMENTS

| CN | 105161517 A | 12/2015 |
| CN | 105741734 A | 7/2016 |
| CN | 207134356 U | 3/2018 |

OTHER PUBLICATIONS

International Search Report and Written Opinion issued in International Application No. PCT/CN2018/103994, dated Dec. 7, 2018, with English translation.

*Primary Examiner* — Natalia A Gondarenko
(74) *Attorney, Agent, or Firm* — McDermott Will & Emery LLP (57) ABSTRACT

An array substrate, includes a base substrate and a plurality of pixel units arranged in an array on the base substrate. Each pixel unit includes an OLED and a pixel driver circuit. Each pixel unit of at least one of the plurality of pixel units further includes a repair line. An orthographic projection of the repair line on the base substrate partially overlaps with an orthographic projection of an anode of the OLED on the base substrate. The repair line is coupled to a pixel driving circuit in an adjacent pixel unit adjacent to the pixel unit of the plurality of pixel units.

15 Claims, 4 Drawing Sheets

(51) Int. Cl.
    *H01L 51/52*   (2006.01)
    *H01L 51/56*   (2006.01)
(52) U.S. Cl.
    CPC ...... *H01L 51/5206* (2013.01); *H01L 51/5237* (2013.01); *H01L 2251/568* (2013.01)
(58) Field of Classification Search
    CPC . H01L 27/3248; H01L 27/3276; H01L 51/56; H01L 51/5206; H01L 51/5209; H01L 51/5225; H01L 51/5237; H01L 2251/568; H01L 2251/5392; H01L 2027/11875; H01L 21/485; H01L 21/76868; H01L 27/3213; H01L 27/3246; H01L 51/0031; H01L 51/5212; H01L 51/5215; H01L 51/5218; H01L 51/5228; H01L 27/3211; H01L 27/3223; H01L 2227/323; G09G 3/2003; G09G 3/3291; G09G 3/3258; G09G 3/003; G09G 2320/0242; G09G 2320/043; G09G 3/3225
    USPC .................................. 257/40, 59, 88; 438/23
    See application file for complete search history.

(56) References Cited

U.S. PATENT DOCUMENTS

| | | | |
|---|---|---|---|
| 2013/0240914 A1* | 9/2013 | Jin ..................... | H01L 27/3276 257/88 |
| 2015/0309379 A1* | 10/2015 | Yao .................... | G02F 1/13624 257/72 |
| 2016/0118455 A1* | 4/2016 | Kang .................. | H01L 27/3276 257/40 |
| 2016/0189593 A1 | 6/2016 | Lee et al. | |
| 2017/0047557 A1 | 2/2017 | Qu et al. | |
| 2020/0013992 A1 | 1/2020 | Cheng | |

* cited by examiner

ARRAY SUBSTRATE AND DISPLAY DEVICE

CROSS-REFERENCE TO RELATED APPLICATION

This application is a national phase entry under 35 USC 371 of International Patent Application No. PCT/CN2018/103994 filed on Sep. 4, 2018, which claims priority to and benefits of Chinese Patent Application No. 201721127658.4, filed with the Chinese Patent Office on Sep. 4, 2017, titled "ARRAY SUBSTRATE AND DISPLAY DEVICE", which are incorporated herein by reference in their entirety.

TECHNICAL FIELD

The present disclosure relates to the field of display technologies, and in particular, to an array substrate and a display device.

BACKGROUND

Organic light-emitting diodes (abbreviated as OLEDs), especially active-matrix organic light-emitting diodes (abbreviated as AMOLEDs), have been widely used in the display field due to advantages of high brightness, full viewing angle, fast response, and flexible display.

SUMMARY

In a first aspect, some embodiments of the present disclosure provide an array substrate, including a base substrate, and a plurality of pixel units arranged in an array on the base substrate. Each pixel unit includes an OLED and a pixel driving circuit. Each pixel unit of at least one of the plurality of pixel units further includes a repair line. An orthographic projection of the repair line on the base substrate partially or completely overlaps with an orthographic projection of an anode of the OLED on the base substrate. The repair line is coupled to a pixel driving circuit in an adjacent pixel unit adjacent to the pixel unit of the plurality of pixel units.

In some embodiments of the present disclosure, the pixel driving circuit includes at least one thin film transistor. The at least one thin film transistor is a driving thin film transistor, or the at least one thin film transistor includes a driving thin film transistor and a switching thin film transistor.

In some embodiments of the present disclosure, the pixel driving circuit includes a driving thin film transistor, and the repair line is coupled to a drain of the driving thin film transistor in the adjacent pixel unit adjacent to the pixel unit of the plurality of pixel units.

In some embodiments of the present disclosure, the array substrate further includes at least one insulating film layer disposed between the repair line and the anode of the OLED.

In some embodiments of the present disclosure, a via hole is provided in the at least one insulating film layer, and is located in a region where the orthographic projection of the repair line on the base substrate partially overlaps with the orthographic projection of the anode of the OLED on the base substrate. The repair line is coupled to the anode of the OLED through the via hole. A pixel driving circuit of the pixel unit is separated from the anode of the OLED.

In some embodiments of the present disclosure, pixel unit of the plurality of pixel units and the adjacent pixel unit are pixel units in adjacent rows and a same column, and the repair line in the pixel unit of the plurality of pixel units is an extension line of the drain of the driving thin film transistor in the adjacent pixel unit.

In some embodiments of the present disclosure, an orthographic projection of the extension line of the drain of the driving thin film transistor in the adjacent pixel unit on the base substrate partially overlaps with an orthographic projection of an extension line of the anode of the OLED in the pixel unit of the plurality of pixel units on the base substrate to form an overlapping region.

In some embodiments of the present disclosure, the array substrate further includes a passivation layer and a planarization layer that are stacked between the extension line of the drain of the driving thin film transistor and the extension line of the anode of the OLED. A groove is formed in a surface of the planarization layer facing away from the base substrate, and is located in a region where an orthographic projection of the extension line of the drain of the driving thin film transistor on the base substrate partially overlaps with an orthographic projection of the extension line of the anode of the OLED on the base substrate, and a portion of the extension line of the anode of the OLED is filled in the groove.

In some embodiments of the present disclosure, a groove depth of the groove is less than a total thickness of the passivation layer and the planarization layer, and is greater than or equal to a thickness of the planarization layer.

In some embodiments of the present disclosure, the pixel unit of the plurality of pixel units and the adjacent pixel unit are pixel units in adjacent columns and a same row, the repair line in the pixel unit of the plurality of pixel units and a gate of the driving thin film transistor in the adjacent pixel unit are electrically insulated and located in a same layer.

In some embodiments of the present disclosure, the array substrate further includes an interlayer insulating layer disposed between the repair line and the drain of the driving thin film transistor in the adjacent pixel unit, via holes are formed in the interlayer insulating layer, and the drain of the driving thin film transistor is coupled to the repair line through a corresponding one of the via holes.

In some embodiments of the present disclosure, the array substrate further includes an interlayer insulating layer, a passivation layer and a planarization layer that are stacked between the repair line in the pixel unit of the plurality of pixel units and the anode of the OLED in the pixel unit. A groove is formed in a surface of the planarization layer facing away from the base substrate, and is located in a region where the orthographic projection of the repair line on the base substrate partially overlaps with the orthographic projection of the anode of the OLED on the base substrate, and a portion of the anode of the OLED is filled in the groove.

In some embodiments, a groove depth of the groove is less than a total thickness of the interlayer insulating layer, a passivation layer and a planarization layer, and is greater than or equal to a thickness of the planarization layer.

In some embodiments of the present disclosure, the array substrate further includes gate lines and data lines that are disposed crosswise. A gate of the switching thin film transistor is coupled to a corresponding gate line, and a source of the switching thin film transistor is coupled to a corresponding data line.

In some embodiments of the present disclosure, the array substrate further includes gate lines and data lines that are disposed crosswise, and pixel units in a same row correspond to a same gate line. An orthographic projection of the repair line in each pixel unit on the base substrate intersects with an orthographic projection of a corresponding gate line on the base substrate.

In some embodiments of the present disclosure, the array substrate further includes gate lines and data lines that are disposed crosswise, and pixel units in a same column correspond to a same data line. An orthographic projection of the repair line on the base substrate intersects with an orthographic projection of a corresponding data line on the base substrate.

In some embodiments of the present disclosure, the array substrate further includes a pixel defining layer disposed on surfaces of anodes of OLEDs facing away from the base substrate.

In another aspect, some embodiments of the present disclosure provide a display device, including the array substrate as described in the first aspect. The array substrate includes a base substrate and a plurality of pixel units arranged in an array on the base substrate. Each pixel unit includes an OLED and a pixel driving circuit. Each pixel unit of at least one of the plurality of pixel units further includes a repair line, and the repair line is electrically insulated from an OLED of the pixel unit. An orthographic projection of the repair line on the base substrate partially overlaps with an orthographic projection of the anode of the OLED on the base substrate. The repair line is coupled to a pixel driving circuit in an adjacent pixel unit adjacent to the pixel unit of the plurality of pixel units.

In some embodiments of the present disclosure, the pixel driving circuit includes a driving thin film transistor, and a repair line in a pixel unit of every two adjacent pixel units is coupled to a drain of a driving thin film transistor in another pixel unit of the two adjacent pixel units.

BRIEF DESCRIPTION OF THE DRAWINGS

In order to describe technical solutions in embodiments of the present disclosure more clearly, the accompanying drawings to be used in the description of embodiments will be introduced briefly. Obviously, the drawings to be described below are merely some embodiments of the present disclosure, and an ordinary person skilled in the art can obtain other drawings according to these drawings without paying any creative effort.

DETAILED DESCRIPTION

In order to make the objects, technical solutions and advantages of the embodiments of the present disclosure clearer, the technical solutions in embodiments of the present disclosure will be described clearly and completely with reference to the drawings in embodiments of the present disclosure. Obviously, the described embodiments are some but not all of embodiments of the present disclosure. All other embodiments obtained on the basis of the embodiments of the present disclosure by an ordinary person skilled in the art without paying any creative effort shall be included in the protection scope of the present disclosure.

As described above, in the display field, the array substrate including active-matrix organic light-emitting diodes (AMOLEDs) has a plurality of pixel units arranged in an array. Pixel units in a same row share a gate line, and pixel units in a same column share a data line. Each pixel unit includes an organic light-emitting diode (OLED) and a pixel driving circuit coupled to an anode of the OLED.

Figure 1:
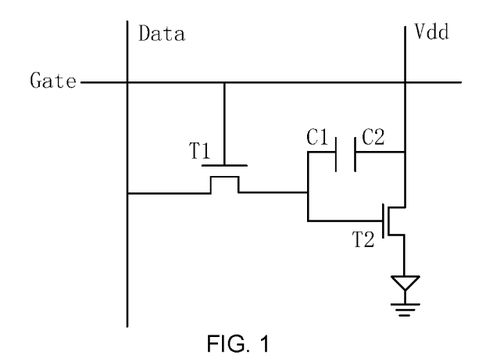
FIG. 1 is a circuit schematic diagram of a pixel driving circuit in the related art.

The circuit schematic diagram of the pixel driving circuit is shown in FIG. 1. The pixel driving circuit includes a switching thin film transistor T1, a driving thin film transistor T2, and a storage capacitor. A gate of the switching thin film transistor T1 is coupled to a gate line Gate, a source of the switching thin film transistor T1 is coupled to a data line Data, and a drain of the switching thin film transistor T1 is coupled to a gate of the driving thin film transistor T2 and a plate C1 of the storage capacitor. A source of the driving thin film transistor T2 is coupled to another plate C2 of the storage capacitor and a power line Vdd, and a drain of the driving thin film transistor T2 is coupled to the anode of the OLED.

However, since the structures of the pixel driving circuits in the pixel units are relatively complicated, the manufacturing process of the array substrate in which the pixel units are located is also complicated. As a result, in the manufacturing process of the array substrate, it is inevitable to result in a defect that a part of wirings in the pixel driving circuits are open circuit, and the position where the open circuit occurs is a open-circuit point X'. In this case, for a pixel driving circuit having a complicated structure, it is difficult to accurately determine the position of the open-circuit point X' by using an existing fault detection technology, and thus it is impossible to effectively repair the array substrate having the defect that the pixel driving circuit is open circuit.

Based on the above problem, the technical solutions in embodiments of the present disclosure will be described in detail in conjunction with the drawings.

Figure 2:
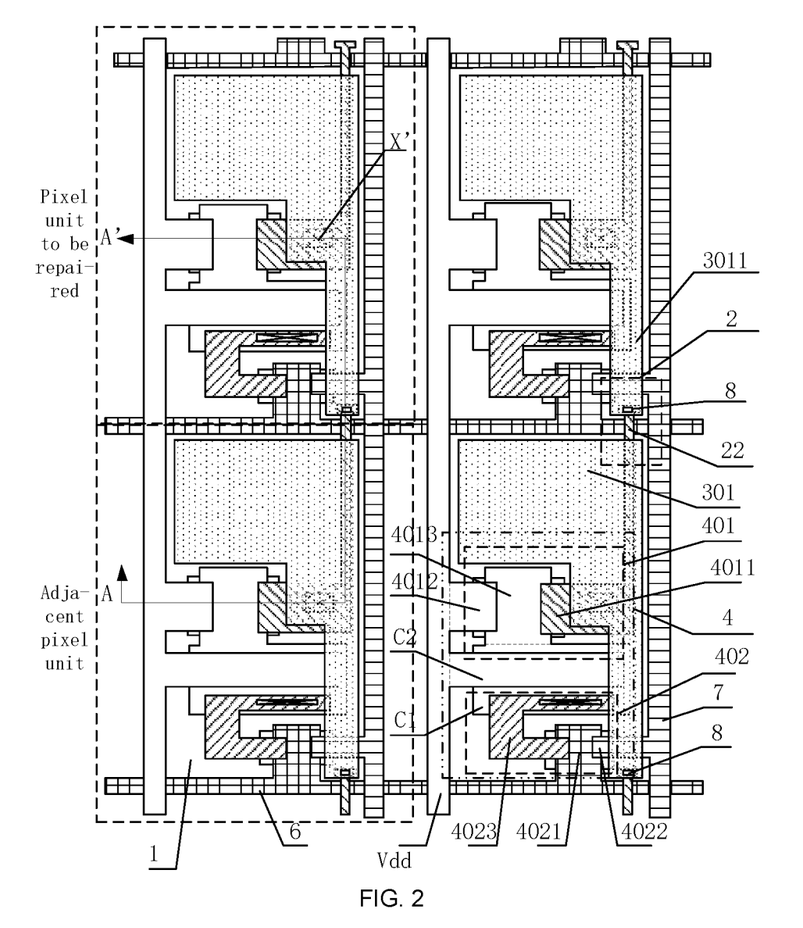
FIG. 2 is a schematic top view of an array substrate, in accordance with some embodiments of the present disclosure.
Figure 3:
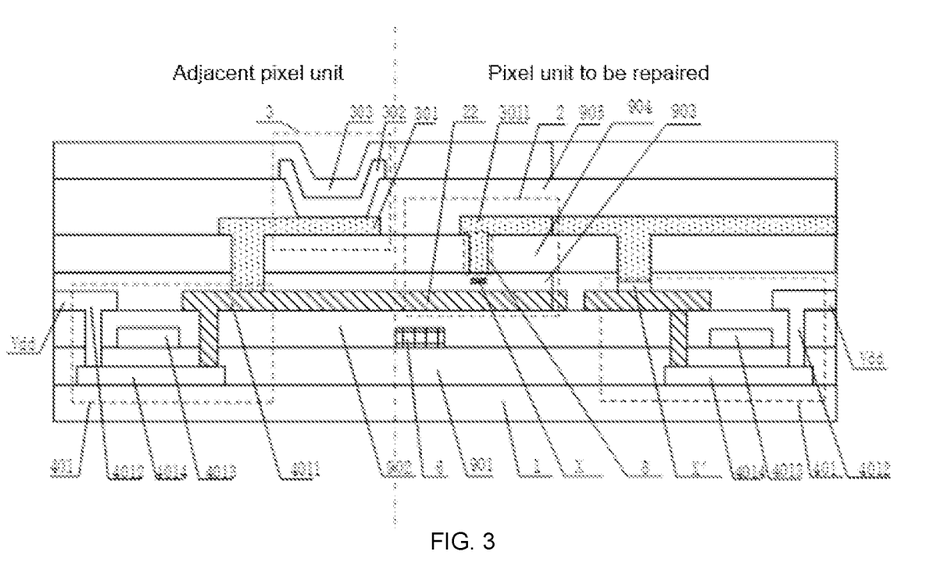
FIG. 3 is a schematic cross-sectional view of the array substrate shown in FIG. 2 along a fold line A-A'.

FIGS. 2 and 3 illustrate an array substrate provided by some embodiments of the present disclosure. Referring to FIGS. 2 and 3, the array substrate provided by some embodiments of the present disclosure includes a base substrate 1 and a plurality of pixel units arranged in an array on the base substrate 1. As shown in FIG. 2, four pixel units are provided. Each pixel unit includes an open-circuit repair structure 2, an OLED 3, and a pixel driving circuit 4. The open-circuit repair structure 2 includes a repair line 22, and an orthographic projection of the repair line 22 on the base substrate 1 partially or completely overlaps with an orthographic projection of an anode 301 of the OLED on the base substrate 1 to form an overlapping region. The open-circuit repair point X is located in the overlapping region.

The above array substrate is prone to a defect, i.e., the open-circuit point X', in the manufacturing process due to its complicated pixel driving structure. The repair line 22 has an overlapping portion with the anode 301 of the OLED, and the overlapping portion is embodied on an orthographic projection of the two on the substrate, so that the open-circuit repair point X is located in the overlapping region, enabling the anode 301 of the OLED of any one of two adjacent pixel units to be coupled to a drain 4011 of the driving thin film transistor 401 of another pixel unit of the two adjacent pixel units, thereby repairing the open-circuit point X' without affecting other components.

In some embodiments of the present disclosure, as shown in FIG. 3, in a pixel unit, in a case where an open circuit, i.e., an open-circuit point X', occurs between the drain 4011 of the driving thin film transistor 401 and the anode 301 of the OLED, the driving thin film transistor 401 cannot be coupled to the anode 301 of the OLED, so the pixel unit cannot emit light. In this case, the pixel unit is referred to as a pixel unit to be repaired, and a pixel unit around it is referred to as an adjacent pixel unit. Since the drain 4011 of the driving thin film transistor 401 in the adjacent pixel unit adjacent to the pixel unit to be repaired is coupled to the repair line 22, and the repair line 22 is coupled to the anode 301 of the OLED in the pixel unit to be repaired, the open-circuit point X is repaired, so that the anode 31 of the OLED in the pixel unit to be repaired is coupled to the drain 4011 of the driving thin film transistor 401 in the adjacent pixel unit, thereby causing the pixel unit to be repaired to be restored to emit light.

Currently, all flat panel displays are driven in a matrix driving mode. The plurality of pixel units are arranged in an array on the base substrate 1 of the array substrate. For convenience of description, in a case where the pixel driving circuit 4 of one of the plurality of pixel units is open circuit, the pixel unit is defined as a pixel unit to be repaired, and a pixel unit around the pixel unit arranged on the base substrate 1 is defined as an adjacent pixel unit.

It will be noted that the pixel unit to be repaired and the adjacent pixel unit belong to a same type of pixel units, and have a same structure and function. A division is only for the purpose of clearly explaining the structure of the array substrate, that is, defining a target pixel unit that may require an open-circuit repair as a pixel unit to be repaired, and another pixel unit adjacent to the pixel unit to be repaired is defined as an adjacent pixel unit. In some embodiments of the present disclosure, in a case where any one of two adjacent pixel units is referred to as the pixel unit to be repaired, another pixel unit of the two adjacent pixel units is referred to as the adjacent pixel unit.

It will be understood that the anode 301 of the OLED and the repair line 22 are located in a same pixel unit. Since the anode 301 of the OLED is provided in the pixel unit, the array substrate having the pixel unit shall be an OLED substrate, that is, each pixel unit of the array substrate is correspondingly provided with an OLED 3 and a pixel driving circuit 4 coupled to the anode 301 of the OLED.

In some embodiments of the present disclosure, the OLED 3 may be any one of a top-emitting OLED, a bottom-emitting OLED, or a double-sided emitting OLED.

It will be noted that only four pixel units arranged in an array are shown in FIG. 2, which are used for emitting light of same or different colors. However, it will be understood by those skilled in the art that the number of pixel units included in the array substrate in the embodiments of the present disclosure is not limited to the four shown, and may include more, and colors of the light emitted by the pixel units are not limited.

In some embodiments of the present disclosure, the pixel driving circuit 4 includes at least one thin film transistor. The at least one thin film transistor includes a driving thin film transistor 401 and a switching thin film transistor 402.

In some embodiments of the present disclosure, the pixel driving circuit 4 for the OLED 3 may include at least one thin film transistor. In a case where the pixel driving circuit 4 includes one thin film transistor, the thin film transistor is a driving thin film transistor 401. In a case where the pixel driving circuit 4 includes a plurality of thin film transistors, the driving thin film transistor 401 refers to a thin film transistor in which the drain 4011 is coupled to the anode 301 of the OLED. The drain 4011 of the driving thin film transistor 401 and the anode 301 of the OLED may be electrically connected.

In some embodiments of the present disclosure, as shown in FIGS. 2 and 3, the provided repair line 22 is coupled to the drain 4011 of the driving thin film transistor 401 in the adjacent pixel unit. An insulating film layer is disposed between the repair line 22 and the anode 301 of the OLED in the pixel unit to be repaired. An orthographic projection of the repair line 22 on the base substrate 1 has an overlapping region with an orthographic projection of the anode 301 of the OLED in the pixel unit to be repaired on the base substrate 1. In the case where the drain 4011 of the driving thin film transistor 401 of the adjacent pixel unit is coupled to the repair line 22, the insulating film layer disposed between the repair line 22 and the anode 301 of the OLED may prevent the repair line 22 from contacting the anode 301 of the OLED, thereby preventing a short circuit between the drain 4011 and the anode 301.

In other words, a film layer for insulation is provided between the anode 301 of the OLED in the pixel unit to be repaired and the repair line 22, and a portion of the anode 301 of the OLED in the pixel unit to be repaired corresponding to the overlapping region is disposed opposite to a portion of the repair line 22 corresponding to the overlapping region. In this way, in a case where a pixel unit to be repaired having an open-circuit defect in the pixel driving circuit is repaired, the open-circuit repair point X will be correspondingly disposed in the overlapping region.

At the open-circuit repair point X, the anode 301 of the OLED of the pixel unit to be repaired is coupled to the repair line 22 by deep penetration laser welding, so that the anode 301 of the OLED of the pixel unit to be repaired and the drain 4011 of the driving thin film transistor 401 in the adjacent pixel unit may be coupled by using the anode 301 of the OLED in the pixel unit to be repaired and the repair line 22.

In some embodiments of the present disclosure, referring to FIGS. 2 and 3, the pixel driving circuit 4 of the OLED 3 includes two thin film transistors, which are a switching thin film transistor 402 and a driving thin film transistor 401. A gate 4021 of the switching thin film transistor 402 is coupled to a gate line 6, and a source 4022 of the switching thin film transistor 402 is coupled to a data line 7, and a drain 4023 of the switching thin film transistor 402 is coupled to the gate 4013 of the driving thin film transistor 401 and the first plate Cl of the storage capacitor. A source 4012 of the driving thin film transistor 401 is coupled to the second plate C2 of the storage capacitor and the power line Vdd, and the drain 4011 of the driving thin film transistor 401 is coupled to the anode 301 of the OLED.

In some embodiments of the present disclosure, the gate line 6 and the data line 7 may be made of one or more of the metal materials, such as copper (Cu), aluminum (Al), molybdenum (Mo), titanium (Ti), chromium (Cr), and tungsten (W), or their alloy materials. For example, a single-layer metal wire is made of copper, and a laminated metal wire is made of Mo\Al\Mo, a laminated metal wire is made of Ti\Cu\Ti, or a laminated metal wire is made of MoTi\Cu, etc.

Based on the array substrate provided by the above embodiments, in a case where a pixel driving circuit is open circuit in a pixel unit, that is, in a case where there is a pixel unit to be repaired, the open-circuit repair structure 2 in the pixel unit to be repaired may be utilized to effectively repair the pixel unit to be repaired, and the anode 301 of the OLED in the pixel unit to be repaired may be coupled to the drain 4011 of the driving thin film transistor 401 in the adjacent pixel unit, so that the OLED 3 in the pixel unit to be repaired may be driven by the driving thin film transistor 401 in the adjacent pixel unit to ensure the normal use of the array substrate.

In some embodiments of the present disclosure, referring to FIG. 2, the pixel units in the array substrate are generally arranged in an array on the base substrate 1. Pixel units in a same row are provided with a control signal by a same gate line 6, and pixel units in a same column are provided with a data signal by a same data line 7.

Therefore, the gate line 6 and the gates of the thin film transistors in the pixel units are generally disposed in a same layer, and the data line 7 and the sources and the drains of the thin film transistors in the pixel units are generally disposed in a same layer. The gate lines and the data lines are disposed crosswise to form a grid structure, so that a single pixel unit is correspondingly disposed in a single grid. Each pixel unit may be a pixel unit to be repaired, or an adjacent pixel unit around a pixel unit to be repaired.

In some embodiments of the present disclosure, referring to FIGS. 2 and 3, each pixel unit generally includes a driving thin film transistor 401 disposed on the base substrate 1, and an OLED 3 disposed at a side of the driving thin film transistor 401 away from the base substrate 1.

The OLED 3 generally includes an OLED anode 301 and an OLED cathode 303 disposed opposite to each other, and an OLED light-emitting layer 302 disposed between the OLED anode 301 and the OLED cathode 303. In a case where the OLED 3 is a bottom-emitting OLED, the OLED cathode 303 is generally made of a metal material such as aluminum (Al), and the OLED anode 301 is generally made of the indium tin oxide (ITO) material. In addition, the OLED light-emitting layer 302 may be a single-layer organic light-emitting layer, or a multilayer structure formed of a hole transport layer, an organic light-emitting layer, an electron transport layer, or the like.

In some embodiments of the present disclosure, the driving thin film transistor 401 may be any one of an oxide semiconductor thin film transistor, a polysilicon thin film transistor, or an amorphous silicon thin film transistor according to the working principle of the thin film transistor. The driving thin film transistor 401 may be any one of a top-gate thin film transistor or a bottom-gate thin film transistor according to the position where the gate of the thin film transistor is disposed, which is not specifically limited in the embodiments of the present disclosure.

For example, referring to FIG. 3, some embodiments of the present disclosure provide a top-gate thin film transistor structure. The top-gate thin film transistor includes an active layer 4014, a gate insulating layer 901, a gate 4013, and an interlayer insulating layer 902 stacked on the base substrate 1. A drain 4011 and a source 4012 are disposed on the interlayer insulating layer 902. The drain 4011 and the source 4012 are coupled to the active layer 4014 respectively through via holes correspondingly formed in the interlayer insulating layer 902 and the gate insulating layer 901. In some embodiments of the present disclosure, the active layer 4014 may be an indium gallium zinc oxide (IGZO) layer. The gate insulating layer 901 may be a single layer structure such as a silicon nitride layer or a silicon oxide layer, or a multilayer structure such as a stacked structure formed of a silicon nitride layer and a silicon oxide layer.

In some embodiments of the present disclosure, referring to FIG. 3, a passivation layer 903, a planarization layer 904, and a pixel defining layer 905 are generally disposed on a surface of the drain 4011 of the driving thin film transistor 401 away from the base substrate 1. The light-emitting layer 302 of the OLED 3 is disposed in an open region of the pixel defining layer 905. In some embodiments of the present disclosure, the passivation layer 903 may be a single layer structure, such as a silicon nitride layer or a silicon oxide layer, or may be a multilayer structure, such as a stacked structure formed of a silicon nitride layer and a silicon oxide layer. The planarization layer 904 is generally a resin layer having a thickness of 1 μm to 4 μm and made of an organic resin material.

In some embodiments of the present disclosure, via holes are formed in the passivation layer 903 and the planarization layer 904. The anode 301 of the OLED is coupled to the drain 4011 of the driving thin film transistor 401 through the via hole formed in the planarization layer 904 and the passivation layer 903. In this case, in the open-circuit repair structure 2 of the pixel unit to be repaired, there is also the passivation layer 903 and the planarization layer 904 disposed between the repair line 22 and the anode 301 of the OLED of the pixel unit to be repaired.

In order to facilitate the fabrication of the open-circuit repair structure, in some embodiments of the present disclosure, referring to FIG. 2, the adjacent pixel unit of the pixel unit to be repaired is a pixel unit in an adjacent row and a same column of the pixel unit to be repaired, that is, any one of the pixel units in adjacent rows and the same column of the pixel unit to be repaired. In this case, the repair line 22 may be provided as an extension line of the drain 4011 of the driving thin film transistor 401 of the pixel unit in the adjacent row and the same column. In this way, the repair line 22 and the drain 4011 of the driving thin film transistor 401 are integrally formed, which may not only simplify the manufacturing process of the pixel repair structure 2 in the pixel unit to be repaired to facilitate the fabrication of the array substrate, but also ensure that the repair line 22 is reliably coupled to the drain 4011 of the driving thin film transistor 401 of the pixel unit in the adjacent row and the same column.

It will be understood that, in some embodiments of the present disclosure, referring to FIG. 2, in a case where the repair line 22 is the extension line of the drain 4011 of the driving thin film transistor 401 of the pixel unit in the adjacent row and the same column, an orthographic projection of the extension line of the drain 4011 on the base substrate 1 partially or completely overlaps with an orthographic projection of an anode extension line 3011 of the anode 301 of the OLED in the pixel unit to be repaired on the base substrate to form an overlapping region.

In some embodiments of the present disclosure, as shown in FIG. 3, the anode extension line 3011 of the anode 301 of the OLED refers to a portion of the anode 301 of the OLED corresponding to the extension line of the drain 4011, that is, the anode extension line 3011 is an integral part of the anode 301 of the OLED.

In a limited space of the array substrate, by using the anode extension line 3011 of the anode 301 of the OLED in the pixel unit to be repaired, and an extension line of the drain 4011 of the driving thin film transistor 401 of the pixel unit in the adjacent row and the same column, the space occupation of the open-circuit repair structure 2 may be optimized while the open-circuit repair structure 2 in the pixel unit to be repaired is formed, which is beneficial to improving the space utilization of the array substrate.

In order to improve repair reliability of the open-circuit repair structure, in some embodiments of the present disclosure, referring to FIG. 3, a groove 8 may be disposed in a region of the planarization layer 904 corresponding to the open-circuit repair point X. The groove depth of the groove 8 may be less than or equal to the thickness of the planarization layer 904. In this way, in a case where the anode extension line 3011 of the anode 301 of the OLED in the pixel unit to be repaired is formed by deposition, the anode extension line 3011 covers and fills the groove 8. Therefore, the distance between the extension line 3011 and the repair line 22 in a corresponding region where the open-circuit repair point X is located is effectively shortened, so as to ensure the reliable welding between the anode extension line 3011 and the repair line 22 when the anode extension line 3011 and the repair line 22 are welded by means of the deep penetration laser welding, thereby improving the conduction reliability of the anode extension line 3011 and the repair line 22 after being repaired and coupled, that is, improving the repair reliability of the open-circuit repair structure 2.

In some embodiments of the present disclosure, with continuous reference to FIG. 2, the gate line 6 and the gates of the thin film transistors in the pixel units are generally disposed in the same layer, the data line 7 and the sources and the drains of the thin film transistors in the pixel units are generally disposed in the same layer, and the gate lines and the data lines are disposed crosswise. In a case where the pixel unit in the adjacent row and the same column is selected as the adjacent pixel unit, an orthogonal projection of the repair line 22 on the base substrate 1 intersects with an orthographic projection of a corresponding gate line 6 on the base substrate 1.

Figure 4:
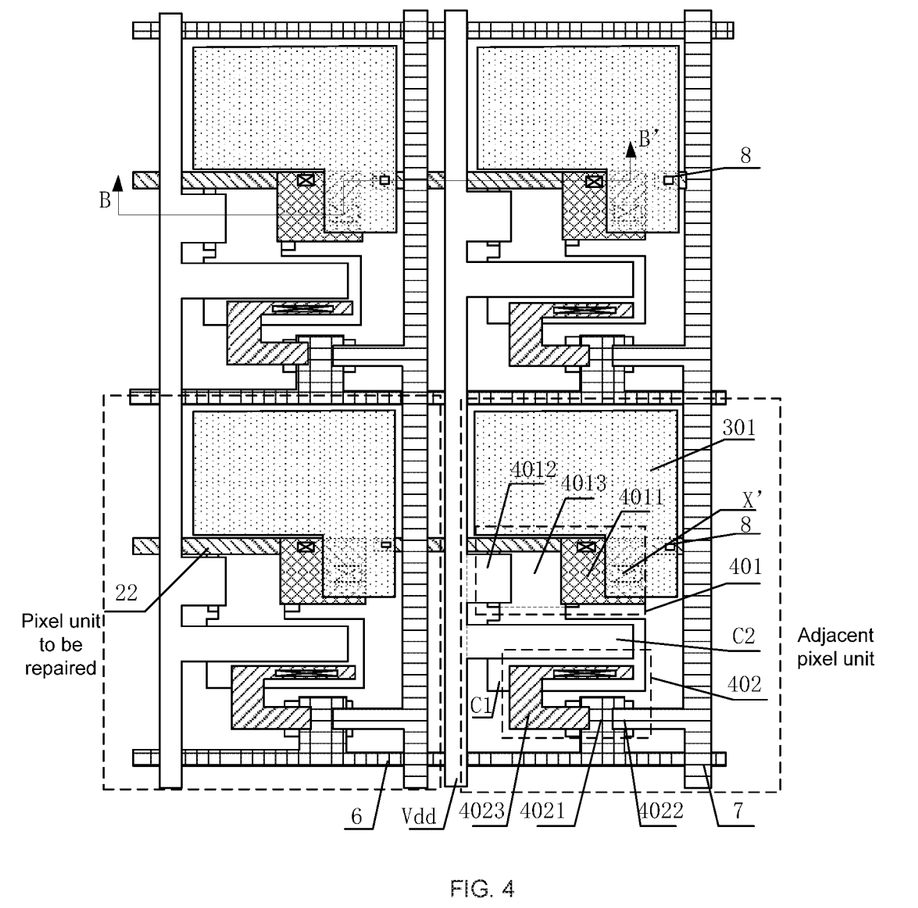
FIG. 4 is another schematic top view of an array substrate, in accordance with some embodiments of the present disclosure.
Figure 5:
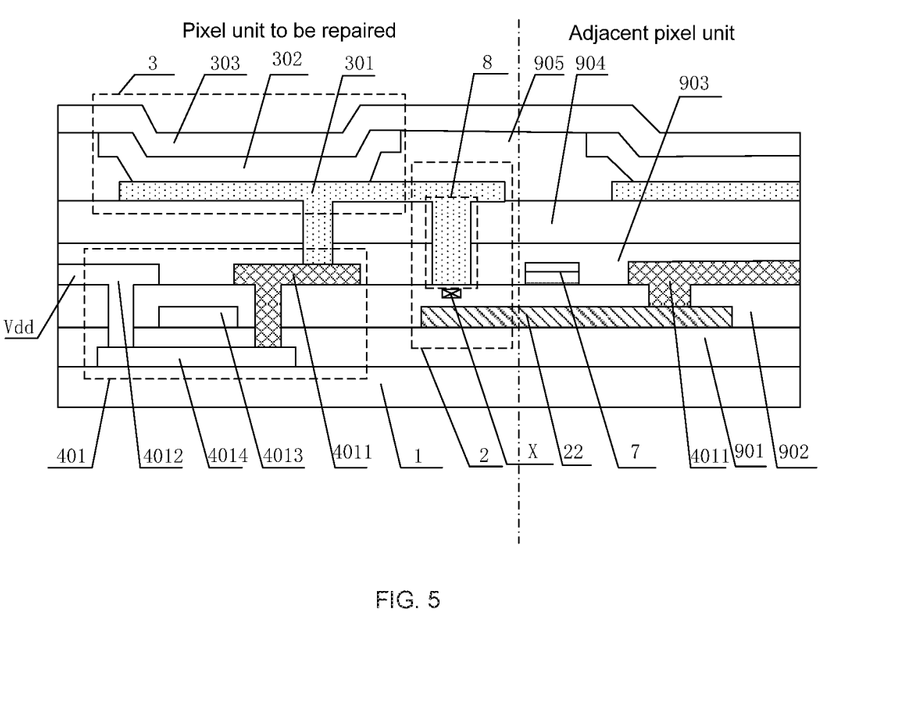
FIG. 5 is a schematic cross-sectional view of the array substrate shown in FIG. 4 along a fold line B-B'.

Based on the above embodiments, FIGS. 4 and 5 provide another arrangement of the pixel units to be repaired and the adjacent pixel units on the array substrate.

FIG. 4 is another schematic top view of an array substrate, in accordance with some embodiments of the present disclosure.

The difference between the array substrate shown in FIGS. 4 and 5 and the array substrate shown in FIGS. 2 and 3 mainly lies in the arrangement of the repair line 22 in the open-circuit repair structure 2. However, other structures in the pixel unit, such as the OLED or the driving thin film transistor, are the same as or similar to those in the array substrate shown in FIGS. 2 and 3, which will not be described again. The relevant parts can refer to part of the description of the array substrate shown in FIGS. 2 and 3.

Referring to FIGS. 4 and 5, in the array substrate provided by some embodiments of the present disclosure, every two adjacent pixel units are pixel units in the adjacent columns and the same row, that is, the adjacent pixel unit of the pixel unit to be repaired is a pixel unit in the adjacent column and the same row of the pixel unit to be repaired. The repair line 22 in the open-circuit repair structure 2 of the pixel unit to be repaired is coupled to the drain 4011 of the driving thin film transistor 401 of the pixel unit in the adjacent column and the same row. In this way, after the anode 301 of the OLED of the pixel unit to be repaired and the repair line 22 are coupled at the open-circuit repair point X by means of the deep penetration laser welding, the anode 301 of the OLED of the pixel unit to be repaired and the repair line 22 may be utilized to achieve that the anode 301 of the OLED in the pixel unit to be repaired and the drain 4011 of the driving thin film transistor of the pixel unit in the adjacent column and the same row are coupled, thereby driving the OLED 3 in the pixel unit to be repaired by utilizing the driving thin film transistor 401 of the pixel unit in the adjacent column and the same row.

It will be understood that, as shown in FIGS. 4 and 5, in this arrangement, in a case where an open circuit, that is, the open-circuit point X', occurs between the drain 4011 of the driving thin film transistor 401 of any one of the pixel units and the anode 301 of the OLED in the pixel unit, the pixel unit is the pixel unit to be repaired, and the pixel unit around it is the adjacent pixel unit. Similar to the previous arrangement of the pixel unit, since the drain 4011 of the driving thin film transistor 401 of the adjacent pixel unit is coupled to the repair line 22 in the pixel unit to be repaired, the drain 4011 of the driving thin film transistor 401 of the adjacent pixel unit is coupled to the anode 301 of the OLED in the pixel unit to be repaired through the repair line 22, thereby repairing the open circuit, and the pixel unit to be repaired re-emit light.

In some embodiments of the present disclosure, referring to FIG. 4, the pixel units in the array substrate are generally arranged in an array on the base substrate. Pixel units in a same row are provided with a control signal by a same gate line 6, and pixel units in a same column are provided with a data signal by a same data line 7. In some embodiments of the present disclosure, the gate line 6 is generally disposed in the same layer as the gates of the thin film transistors in the pixel units, and the data line 7 is generally disposed in the same layer as the sources and the drains of the thin film transistors of the pixel units. Gate lines and data lines are disposed crosswise to form a grid structure, so that a single pixel unit is correspondingly disposed in a single grid. Each pixel unit may be a pixel unit to be repaired, or an adjacent pixel unit around a pixel unit to be repaired.

As shown in FIG. 4, only four pixel units arranged in an array are shown in FIG. 4, which are used for emitting light of the same or different colors. However, it will be understood by those skilled in the art that the number of pixel units provided by the array substrate provided by the embodiments of the present disclosure is not limited to the four shown, and may include more, and colors of the light emitted by the pixel units are not limited.

In some embodiments of the present disclosure, the data line 7 and the sources and the drains of the thin film transistors in the pixel units are generally disposed in the same layer. In a case where the repair line 22 is coupled to the drain 4011 of the driving thin film transistor 401 of the pixel unit in the adjacent column and the same row, the repair line 22 needs to correspondingly pass through a region where the data line 7 is disposed. Therefore, in order to prevent the repair line 22 from being coupled to the data line 7, in some embodiments of the present disclosure, the repair line 22 and the gate 4013 of the driving thin film transistor 401 of the pixel unit in the adjacent column and the same row are disposed in the same layer and insulated from each other.

For example, referring to FIGS. 4 and 5, in some embodiments of the present disclosure, the gate 4013 of the driving thin film transistor 401 of each pixel unit is disposed at a side of the drain 4011 away from the anode 301 of the OLED, and an interlayer insulating layer 902 is provided between the gate 4013 and the drain 4011.

The repair line 22 and the gate 4013 of the driving thin film transistor 401 are disposed in the same layer and insulated from each other. In this way, the repair line 22 and the gate 4013 of the driving thin film transistor 401 may be formed in a single patterning process, which is advantageous for simplifying the manufacturing process of the open-circuit repair structure in the pixel unit to improve the production efficiency of the array substrate.

In some embodiments of the present disclosure, via holes are formed in the interlayer insulating layer 902. In this case, the drain 4011 of the driving thin film transistor 401 of the pixel unit in the adjacent column and the same row is coupled to the repair line 22 through the via hole provided in the interlayer insulating layer 902. In a case where the data line 7 and the drain 4011 of the driving thin film transistor 401 are disposed in the same layer, an orthographic projection of the repair line 22 on the base substrate intersects with an orthographic projection of a corresponding data line 7 on the base substrate.

In some embodiments of the present disclosure, referring to FIG. 5, the passivation layer 903 and the planarization layer 904 are generally stacked on a surface of the drain 4011 of the driving thin film transistor 401 proximate to the anode 301 of the OLED. The anode 301 of the OLED is coupled to the drain 4011 of the driving thin film transistor 401 through the via hole provided in the planarization layer 904 and the passivation layer 903. In this case, in the open-circuit repair structure 2 of the pixel unit to be repaired, since the repair line 22 and the gate 4013 of the driving thin film transistor 401 of the pixel unit in the adjacent column and the same row are disposed in the same layer and insulated from each other, the interlayer insulating layer 902, the passivation layer 903, and the planarization layer 904 are sequentially disposed between the repair line 22 and the anode 301 of the OLED in the pixel unit to be repaired.

In order to improve the repair reliability of the open-circuit repair structure, in some embodiments of the present disclosure, a groove 8 is formed in a region of the planarization layer 904 corresponding to the open-circuit repair point X, and a groove 8 may also be formed in regions of the planarization layer 904 and the passivation layer 903 corresponding to the open-circuit repair point X. In this case, the groove depth of the groove 8 is less than or equal to the total thickness of the planarization layer 904 and the passivation layer 903.

In a case where the anode 301 of the OLED in the pixel unit to be repaired is formed by deposition, the anode 301 of the OLED covers and fills the groove 8, and in this way, the distance between the anode 301 of the OLED in the pixel unit to be repaired and the repair line 22 in a corresponding region of the open-circuit repair point X is effectively shortened, so as to ensure the reliable welding between the anode 301 of the OLED in the pixel unit to be repaired and the repair line 22 when the anode 301 and the repair line 22 are welded by means of the deep penetration laser welding, thereby improving the conduction reliability of the anode 301 of the OLED in the pixel unit to be repaired and the repair line 22 after being repaired and coupled, that is, improving the repair reliability of the open-circuit repair structure 2.

With continuous reference to FIGS. 3 and 5, in the array substrate provided in some embodiments of the present disclosure, the pixel defining layer 905 is generally disposed on a surface of the planarization layer 904 away from the base substrate 1. The pixel defining layer 905 is generally a resin layer having a thickness of 1 μm to 3 μm and made of an organic resin material. The light-emitting layer 302 of the OLED 3 is generally disposed in an open region of the pixel defining layer 905. In this case, in the open-circuit repair structure of the pixel unit to be repaired, a portion of the anode 301 of the OLED corresponding to the open-circuit repair point X is covered with the pixel defining layer 905, so that the open-circuit repair structure of a normal array substrate is insulated and protected by utilizing the pixel defining layer 905.

Some embodiments of the present disclosure further provide a display device. The display device includes the above array substrate. The array substrate includes a base substrate and a plurality of pixel units arranged in an array on the base substrate. Each pixel unit includes an open-circuit repair structure, an OLED, and a pixel driving circuit, and the open-circuit repair structure includes a repair line. An orthographic projection of the repair line on the base substrate partially or completely overlaps with an orthographic projection of the anode of the OLED on the base substrate to form an overlapping region. An open-circuit repair point is disposed in the overlapping region. The array substrate in the display device has same advantages as the array substrate in the above embodiments, which will not be described herein again.

For example, the display device provided by some embodiments of the present disclosure may be a product or component having a display function, such as a mobile phone, a tablet computer, a television, a display, a notebook computer, a digital photo frame, or a navigator.

In the above description of the embodiments, specific features, structures, materials or characteristics may be combined in any appropriate manner in any one or more embodiments or examples.

The foregoing descriptions are merely some specific implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. An array substrate, comprising:
a base substrate;
at least one insulating film layer; and
a plurality of pixel units arranged in an array on the base substrate, each pixel unit including an OLED and a pixel driving circuit, the pixel driving circuit including a driving thin film transistor, wherein,
each pixel unit of at least one of the plurality of pixel units further includes a repair line;
an orthographic projection of the repair line on the base substrate partially overlaps with an orthographic projection of an anode of the OLED on the base substrate, and the repair line is coupled to a drain of the driving thin film transistor of a pixel driving circuit in an adjacent pixel unit adjacent to the pixel unit of the plurality of pixel units;
the at least one insulating film layer is disposed between the repair line and the anode of the OLED, and comprises a passivation layer and a planarization layer that are stacked; a groove is formed in a surface of the at least one insulating film layer facing away from the base substrate, and is located in a region where the orthographic projection of the repair line on the base substrate partially overlaps with the orthographic projection of the anode of the OLED on the base substrate, and a portion of the anode of the OLED is filled in the groove; and
a groove depth of the groove is less than a total thickness of the at least one insulating film layer, so that the repair line and the anode of the OLED are not coupled by the groove before the pixel unit of the plurality of pixel units is repaired.

2. The array substrate according to claim 1, wherein the pixel driving circuit further includes a switching thin film transistor.

3. The array substrate according to claim 1, wherein the pixel unit of the plurality of pixel units and the adjacent pixel unit are pixel units in adjacent rows and a same column, the repair line in the pixel unit of the plurality of pixel units is an extension line of the drain of the driving thin film transistor in the adjacent pixel unit.

4. The array substrate according to claim 3, wherein an orthographic projection of an extension line of the anode of the OLED in the pixel unit of the plurality of pixel units on the base substrate partially overlaps with an orthographic projection of the extension line of the drain of the driving thin film transistor in the adjacent pixel unit on the base substrate.

5. The array substrate according to claim 4, wherein the passivation layer and the planarization layer are stacked between the extension line of the drain of the driving thin film transistor and the extension line of the anode of the OLED; and the groove is formed in a surface of the planarization layer facing away from the base substrate, and is located in a region where an orthographic projection of the extension line of the drain of the driving thin film transistor on the base substrate partially overlaps with an orthographic projection of the extension line of the anode of the OLED on the base substrate, and a portion of the extension line of the anode of the OLED is filled in the groove.

6. The array substrate according to claim 5, wherein a groove depth of the groove is less than a total thickness of the passivation layer and the planarization layer and is greater than or equal to a thickness of the planarization layer.

7. The array substrate according to claim 1, wherein the pixel unit of the plurality of pixel units and the adjacent pixel unit are pixel units in adjacent columns and a same row, the repair line in the pixel unit of the plurality of pixel units and a gate of the driving thin film transistor in the adjacent pixel unit are electrically insulated and disposed in a same layer.

8. The array substrate according to claim 7, wherein the at least one insulating layer further comprises an interlayer insulating layer disposed between the repair line and the drain of the driving thin film transistor in the adjacent pixel unit, via holes are formed in the interlayer insulating layer, and the drain of the driving thin film transistor is coupled to the repair line through a corresponding one of the via holes.

9. The array substrate according to claim 7, wherein the at least one insulating layer further comprises an interlayer insulating layer stacked with the passivation layer and the planarization layer.

10. The array substrate according to claim 2, further comprising gate lines and data lines that are disposed crosswise, wherein a gate of the switching thin film transistor is coupled to a corresponding gate line, and a source of the switching thin film transistor is coupled to a corresponding data line.

11. The array substrate according to claim 1, further comprising gate lines and data lines that are disposed crosswise, wherein pixel units in a same row correspond to a same gate line; and an orthographic projection of the repair line in each pixel unit on the base substrate intersects with an orthographic projection of a corresponding gate line on the base substrate.

12. The array substrate according to claim 1, further comprising gate lines and data lines that are disposed crosswise, wherein pixel units in a same column correspond to a same data line; and an orthographic projection of the repair line on the base substrate intersects with an orthographic projection of a corresponding data line on the base substrate.

13. The array substrate according to claim 1, further comprising a pixel defining layer disposed on surfaces of anodes of OLEDs facing away from the base substrate.

14. A display device, comprising an array substrate, wherein the array substrate includes:

a base substrate;

at least one insulating film layer; and a plurality of pixel units arranged in an array on the base substrate, each pixel unit including an OLED and a pixel driving circuit, the pixel driving circuit including a driving thin film transistor, wherein, each pixel unit of at least one of the plurality of pixel units further includes a repair line, and the repair line is electrically insulated from an OLED of the pixel unit;

an orthographic projection of the repair line on the base substrate partially overlaps with an orthographic projection of an anode of the OLED on the base substrate, and the repair line is coupled to a drain of the driving thin film transistor of a pixel driving circuit in an adjacent pixel unit adjacent to the pixel unit of the plurality of pixel units;

the at least one insulating film layer is disposed between the repair line and the anode of the OLED, and comprises a passivation layer and a planarization layer that are stacked; a groove is formed in a surface of the at least one insulating film layer facing away from the base substrate, and is located in a region where the orthographic projection of the repair line on the base substrate partially overlaps with the orthographic projection of the anode of the OLED on the base substrate, and a portion of the anode of the OLED is filled in the groove;

a groove depth of the groove is less than a total thickness of the at least one insulating film layer, so that the repair line and the anode of the OLED are not coupled by the groove before the pixel unit of the plurality of pixel units is repaired.

15. The array substrate according to claim 9, wherein a groove depth of the groove is less than a total thickness of the interlayer insulating layer, the passivation layer and the planarization layer, and is greater than or equal to a thickness of the planarization layer.

* * * * *